US009335080B2

(12) United States Patent
Ward et al.

(10) Patent No.: US 9,335,080 B2
(45) Date of Patent: May 10, 2016

(54) TEMPERATURE SYSTEM HAVING AN IMPURITY FILTER

(75) Inventors: Britton N. Ward, Medway, MA (US); Norbert W. Elsdoerfer, Warwick, RI (US)

(73) Assignee: Temptronic Corporation, Mansfield, MA (US)

( * ) Notice: Subject to any disclaimer, the term of this patent is extended or adjusted under 35 U.S.C. 154(b) by 604 days.

(21) Appl. No.: 13/274,967

(22) Filed: Oct. 17, 2011

(65) Prior Publication Data
US 2013/0092356 A1  Apr. 18, 2013

(51) Int. Cl.
| | |
|---|---|
| *F25B 47/00* | (2006.01) |
| *F25B 43/00* | (2006.01) |
| *H05K 7/20* | (2006.01) |
| *F25B 19/00* | (2006.01) |
| *H01L 23/467* | (2006.01) |
| *H01L 23/473* | (2006.01) |

(52) U.S. Cl.
CPC .......... *F25B 43/003* (2013.01); *H05K 7/20272* (2013.01); *F25B 19/005* (2013.01); *F25D 2400/02* (2013.01); *H01L 23/467* (2013.01); *H01L 23/473* (2013.01); *H01L 2924/0002* (2013.01)

(58) Field of Classification Search
CPC .......... F25B 45/00; F25C 5/005; F25C 5/007
USPC ............ 62/50.1, 85, 340, 344; 165/80.1, 119, 165/185
See application file for complete search history.

(56) References Cited

U.S. PATENT DOCUMENTS

| | | | | |
|---|---|---|---|---|
| 2,631,731 | A | * | 3/1953 | Stevens .................. 210/132 |
| 5,423,194 | A | * | 6/1995 | Senecal .................. 62/457.6 |
| 6,019,164 | A | | 2/2000 | Getchel |
| 6,033,484 | A | * | 3/2000 | Mahoney ................ 134/1 |
| 6,073,681 | A | | 6/2000 | Getchel |
| 6,328,096 | B1 | | 12/2001 | Stone |
| 6,531,100 | B1 | | 3/2003 | Ogata et al. |
| 6,700,099 | B2 | | 3/2004 | Cole |

(Continued)

FOREIGN PATENT DOCUMENTS

| | | |
|---|---|---|
| EP | 1167905 A2 | 1/2002 |
| JP | 04254737 | 9/1992 |
| JP | 2001066027 A | 3/2001 |

(Continued)

OTHER PUBLICATIONS

Dean, "Analysis of Flow Electrification in Fuel Distribution Systems," IEEE Transactions on Industry Applications, vol. 29, No. 3, pp. 639-644, 1993.
Temperature Control Apparatus sold under the trademark THERMOSTREAM, examples: model TP04300, TP04310, TP4500, manufactured and sold by Temptronic Corporation, Mansfield, Massachusetts.

(Continued)

*Primary Examiner* — Melvin Jones
(74) *Attorney, Agent, or Firm* — Burns & Levinson, LLP; Steven M. Mills

(57) ABSTRACT

A temperature control system for controlling a temperature of a device under test includes a fluid source and a cooling device reducing a temperature of the fluid supplied by the fluid source and outputting the fluid having the reduced temperature to a device under test. A filter is positioned between the device under test and the cooling device to filter out ice particles that lead to significant charge generation in order to prevent the device under test from being subjected to high voltages as a result of static charge generation.

40 Claims, 4 Drawing Sheets

(56) References Cited

U.S. PATENT DOCUMENTS

| | | |
|---|---|---|
| 6,744,270 B2 | 6/2004 | Stone |
| 2002/0000096 A1 | 1/2002 | Trembley et al. |

FOREIGN PATENT DOCUMENTS

| | | |
|---|---|---|
| JP | 2002224513 A | 8/2002 |
| JP | 2002305095 | 10/2002 |
| JP | 2003036994 | 7/2003 |
| JP | 2006283991 | 10/2003 |
| JP | 2006283991 A | 10/2006 |
| JP | 2008537322 | 9/2008 |
| JP | 2009144998 | 7/2009 |
| JP | 2010002136 A | 1/2010 |
| JP | 2011091149 A | 5/2011 |

OTHER PUBLICATIONS

Wire mesh manufactured and sold by TWP, Inc., Berkeley, California, under part No. 325X2300TL0014W48T.

International Search Report issued in International Application No. PCT/US12/060599, Jul. 15, 2013.

International Preliminary Report on Patentability issued in International Application No. PCT/US12/060599, Apr. 22, 2014.

Communication from the European Patent Office dated Jun. 4, 2015 in correspondence European Application No. 12787215.8 filed Oct. 17, 2012.

Search Report from the Intellectual Property Office of Singapore, mailed Mar. 17, 2015 in Singapore Patent Application No. 11201401601T filed Oct. 17, 2012.

Office Action mailed Oct. 13, 2015 in corresponding Japanese Application No. 2014-537174, filed Oct. 17, 2012.

\* cited by examiner

TEMPERATURE SYSTEM HAVING AN IMPURITY FILTER

BACKGROUND

The present disclosure is related to a temperature system having an impurity filter. More particularly, the present invention is related to a temperature system having an impurity filter to eliminate charge collection and voltage generation in a fluid either circulating in the temperature system or being provided by the temperature system.

In testing electronic devices, with the development of smaller, low-power devices, devices under test have become more sensitive to environmental factors. Many factors need to be taken into account in the testing of the devices. These environmental factors include temperature, humidity, fluid properties and exposure to flow electrification, i.e., static charge. If the environmental factors are not properly regulated, damage or destruction of the devices may result. However, adjusting the testing environments to accommodate these environmental factors may be disadvantageous to the proper testing of the devices.

SUMMARY

According to one aspect, the disclosure is directed to a temperature system for providing a cooling fluid. The temperature system includes a fluid source and a cooling device for chilling the cooling fluid supplied by the fluid source to generate a chilled fluid and outputting the chilled cooling fluid. A filter receives the chilled cooling fluid from the cooling device. The filter includes a filter mesh sized to capture ice particles in the chilled cooling fluid.

In some exemplary embodiments, the filter mesh is sized to capture ice particles having a size greater than or equal to 2 μm. In some exemplary embodiments, the filter mesh is sized to capture ice particles having a size less than 10 μm. In some exemplary embodiments, the filter mesh is sized to capture ice particles having a size less than 100 μm.

In some exemplary embodiments, the cooling fluid comprises air. In some exemplary embodiments, the cooling fluid comprises a liquid.

In some exemplary embodiments, the filter mesh comprises stainless steel.

In some exemplary embodiments, the filter mesh is in a Dutch weave configuration.

According to another aspect, the disclosure is directed to a temperature control system for providing a temperature-controlled fluid. The temperature control system includes a source of fluid and a fluid chiller receiving fluid from the source, chilling the fluid to generate the temperature-controlled fluid and outputting the temperature-controlled fluid. A filter receives the temperature-controlled fluid. The filter includes a filter mesh sized to capture ice particles in the temperature-controlled fluid.

In some exemplary embodiments, the filter mesh is sized to capture ice particles having a size greater than or equal to 2 μm. In some exemplary embodiments, the filter mesh is sized to capture ice particles having a size less than 10 μm. In some exemplary embodiments, the filter mesh is sized to capture ice particles having a size less than 100 μm.

In some exemplary embodiments, the cooling fluid comprises air. In some exemplary embodiments, the cooling fluid comprises a liquid.

In some exemplary embodiments, the filter mesh comprises stainless steel.

In some exemplary embodiments, the filter mesh is in a Dutch weave configuration.

In some exemplary embodiments, the temperature control system further comprises a heater for heating the temperature-controlled fluid. In some exemplary embodiments, the heater receives the temperature-controlled fluid from the filter.

In some exemplary embodiments, the temperature-controlled fluid is directed onto a device under test (DUT) to control temperature in the DUT.

According to another aspect, the disclosure is directed to a temperature control system for a chuck. The temperature control system includes a circulating fluid chiller for generating a chilled fluid. The circulating fluid chiller includes a pump for circulating fluid through the system and the chuck and a heat exchanger chilling the fluid to generate the chilled fluid and outputting the chilled fluid to the chuck. A filter is disposed between the heat exchanger and the chuck. The filter includes a filter mesh sized to capture ice particles in the chilled fluid.

In some exemplary embodiments, the filter mesh is sized to capture ice particles having a size greater than or equal to 2 μm. In some exemplary embodiments, the filter mesh is sized to capture ice particles having a size less than 10 μm. In some exemplary embodiments, the filter mesh is sized to capture ice particles having a size less than 100 μm.

In some exemplary embodiments, the cooling fluid comprises air. In some exemplary embodiments, the cooling fluid comprises a liquid.

In some exemplary embodiments, the filter mesh comprises stainless steel.

In some exemplary embodiments, the filter mesh is in a Dutch weave configuration.

BRIEF DESCRIPTION OF DRAWINGS

The foregoing and other features and advantages of the disclosure will be apparent from the following more particular description of preferred embodiments of the disclosure, as illustrated in the accompanying drawings in which like reference characters refer to the same parts throughout the different views. The drawings are not necessarily to scale, emphasis instead being placed upon illustrating the principles of the disclosure.

DETAILED DESCRIPTION

Figure 1:
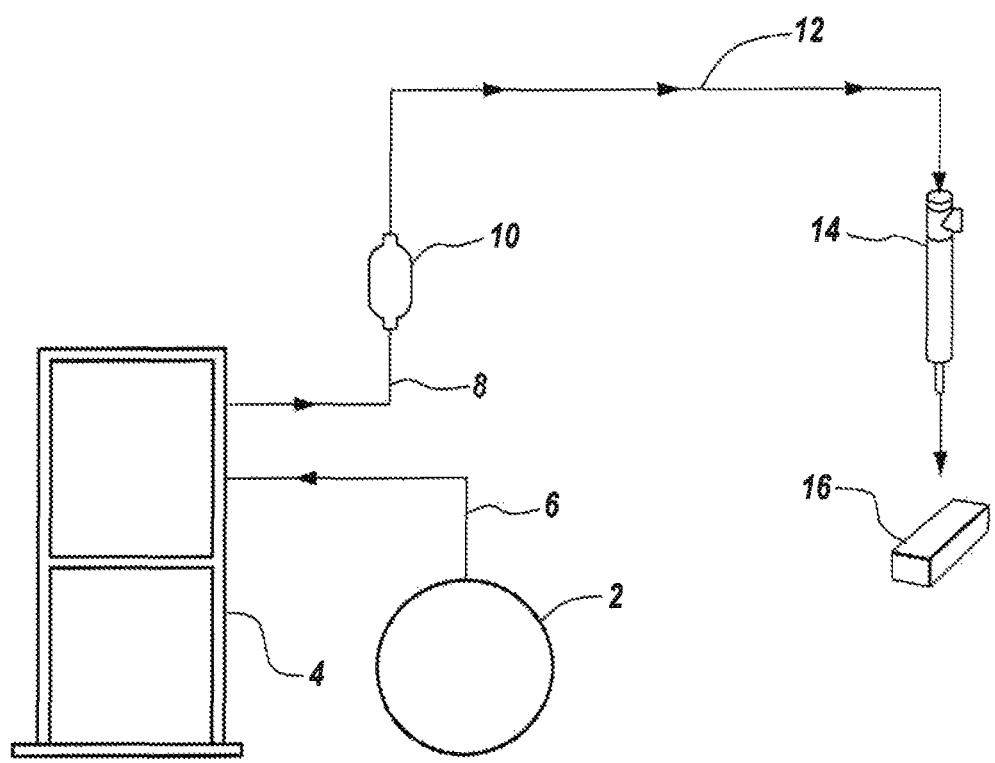
FIG. 1 is a schematic block diagram illustrating a temperature system, according to some exemplary embodiments.

Hot and cold environmental test systems for quality assurance, characterization, failure analysis and production testing simulate a temperature environment, for example, −90° C. to 225° C., to which devices, PCBs, modules and other components (each collectively referred to herein as a device under test (DUT)), may be exposed throughout their useful lives. These test systems provide quick, convenient thermal testing and cycling production testing, design verification and quality assurance. The test system may include a source of temperature-controlled fluid such as air, for example, a temperature control apparatus sold under the trademark THERMOSTREAM®, for example, model TP04300, TP04310, TP4500 or other such system, manufactured and sold by Temptronic Corporation of Mansfield, Mass., USA, that is used as an open-loop or closed-loop temperature source for controlling the temperature. The present disclosure is also applicable to an open-loop temperature system which does not provide closed-loop temperature control, but, rather, is a source of chilled fluid such as air. Such a source can be, for example, the chiller unit associated with the THERMOSTREAM® temperature control apparatus referenced above. It can be used in the device testing environment, but, according to the present disclosure, it need not be so applied.

A temperature system according to the present disclosure can be used to test electronic devices. These electronic devices cannot be exposed to high voltages such as a voltage generated as a result of static charge generation, since such exposure will likely result in damage to or destruction of the devices. In these systems, due to the development of smaller, low-powered devices, failures in DUTs have occurred due to static charge generation. Undesirable static charge can also be generated in the open-loop chiller output, independent of the testing environment.

One cause of the static electric charge generation has been determined to be a flow electrification phenomenon. Flow electrification involves an exchange of charge across an interface between two dissimilar materials. Flow electrification may occur within low conductivity fluids flowing through pipelines. The ability of a fluid to retain an electrostatic charge depends on its electrical conductivity. When low conductivity fluids flow through pipelines or are mechanically agitated, contact-induced charge separation, namely, flow electrification, occurs. Charge generation increases at higher fluid velocities and larger pipe diameters. Many semiconductor devices are particularly sensitive to flow electrification. Lightning is a natural example of static discharge in which the initial charge separation, namely, the flow electrification, is associated with contact between ice particles and storm clouds.

In testing using a temperature control apparatus, or in producing an output of chilled fluid, large amounts of static are generated with wet air, and flow electrification causes static generation to occur at or below a dew point temperature. Specifically, damp air in a chiller generates ice crystals, and the ice crystals induce the flow electrification. The ice crystals, in a similar manner to a thunderstorm, move about collecting charges.

In the chilling systems of the present disclosure, ice crystals or ice particles are generated when a temperature of a fluid from a fluid cooling device, for example, the chiller, reaches its dew point. The generation of ice crystals results in the generation of static. The rate of charge generation in the fluid is proportional to flow rate. That is, a higher flow rate of the fluid generates charge accumulation faster. At higher temperature set points, charge accumulations are reduced, which indicates that the ice crystals melt and charge accumulation is neutralized. The issues of charge generation due to ice crystals extends to any particles in the air stream that may cause charge generation, for example, oil droplets and dust desiccant escaping from a dryer.

One possible solution is to condition incoming fluid, for example, air, nitrogen or other heat transfer media, to a very low dew point in order to prevent the creation of ice crystals. However, in many situations, fluid in the system cannot be conditioned to the low dew points that are needed to prevent charge generation. This results in failure of air drying systems integral to test systems, which leads to high-dew-point air entering the chiller. When high-dew-point air enters the chiller, ice crystals are formed, which results in electrostatic charge generation. Once ice crystals are formed in the fluid stream they can collect charge on their travel from the output of the fluid cooling device, for example, the chiller, and the delivery point of the fluid at the output of the system. This generates charge collection at the delivery point, which can result in electrostatic discharge and damage.

In conventional test systems, in order to prevent electrostatic discharge damage, a static, electrically conductive drain wire is run through the fluid path, and electrostatic dissipative tubing is used as the fluid path. However, these techniques have not proven to be effective in eliminating charge collection and voltage generation in a fluid circulating in the temperature system.

According to the present disclosure, a filter is provided at a point between a temperature controller, for example, a chiller, which chills a fluid in the system, and a point of delivery of the fluid, e.g., to a device under test (DUT). The filter is of a sufficient size to filter out, i.e., capture, ice particles above a certain size to prevent charge accumulation at the fluid exit point. In some exemplary embodiments, the filter of the present disclosure has the ability to capture particles having a size of 2.0 μm or greater, so that a majority of ice particles that lead to significant charge generation are removed. In some particular exemplary embodiments, the filter of the present disclosure is of a size that captures particles of a size less than 10.0 μm.

The filter of the present disclosure captures ice crystals that are formed in the fluid path between the chiller and the point of delivery of the fluid. In the present disclosure, a mechanical filter is inserted into a fluid path to capture ice particles which generate electric charge in the fluid path. A filter which captures ice particles having a size of 100 μm or less begins to prevent charge generation, that is, shows some reduction in charge generation. A filter of particle size capture of 1.0 μm or less is preferable for capturing particles which generate electric charge in the fluid path. However, limitations of cost and flow restriction due to pressure drop across the filter prevent filtering to below 1 μm. According to some particular exemplary embodiments, a 2-10 μm mesh filter of sufficient cross-sectional area is effective in removing charged particles and limiting static charge generation to acceptable levels. The filter may be positioned anywhere in the fluid path downstream of the cooling device, in the cold path of the fluid.

The insertion of the filter eliminates or substantially reduces the generation of electrostatic charge by ice crystals in a cold fluid, for example, in the chiller output path. This eliminates or substantially reduces the charge generation possibility and therefore prevents damaging voltages from being generated. The present disclosure may be applied to, for example, systems having a chiller, a chiller and a temperature control apparatus, or chiller and a workpiece chuck, or just a chiller cooling a fluid, such as those described in detail herein, or other such system.

FIG. 1 is a schematic block diagram illustrating a temperature system, according to some exemplary embodiments. The temperature system may be, for example, a temperature control apparatus sold under the trademark THERMOSTREAM® by Temptronic Corporation of Mansfield, Mass., USA. In FIG. 1, a fluid supply 2 outputs a fluid, for example, ambient air, to a chiller 4 along a fluid path 6. The chiller 4 outputs the chilled fluid to the ice particle filter 10 along fluid path 8. When the temperature of the fluid from the chiller 4 reaches its dew point, ice crystals are generated. The particle filter 10 filters out, i.e., captures, ice particles formed by the chilling of the fluid in the chiller 4 and other particles which may cause charge generation in the fluid stream. The filtered fluid is provided to the control heater 14 along fluid path 12. The control heater 14 heats the cooled fluid as required to set the temperature of a DUT 16 and outputs the fluid to the DUT 16. Where it is desired to alter the temperature of the fluid output to the DUT 16, the control heater 14 may be selectively activated to raise the temperature or deactivated to lower the temperature of the fluid.

In one embodiment, the DUT 16 may be supported by a workpiece chuck such as those described hereinafter.

Figure 2A:
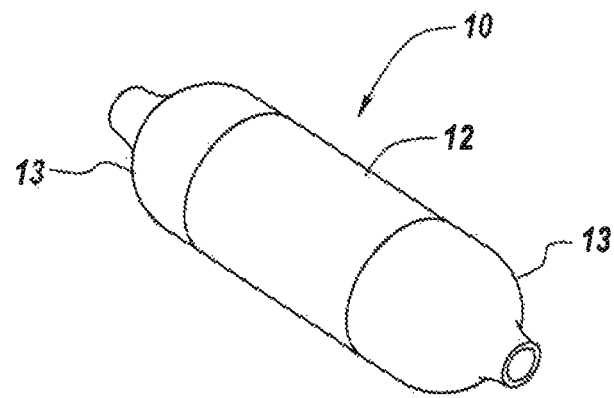
FIG. 2A is a schematic perspective view illustrating a filter, according to some exemplary embodiments.

FIG. 2A is a schematic perspective view of the filter 10, according to some exemplary embodiments. Referring to FIG. 2A, the filter 10 includes a main body, which includes a central section 12 and two end sections 13. In some particular exemplary embodiments, the filter main body is formed of a shell formed from spun copper tubing. The copper spinning process forms the end sections 13.

Figure 2B:
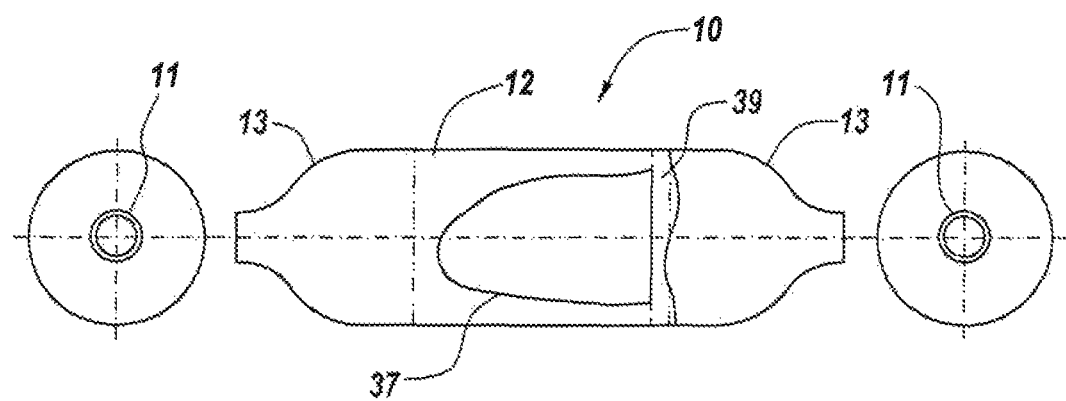
FIG. 2B is a schematic cross-sectional view illustrating the filter of FIG. 2A, according to some exemplary embodiments.

FIG. 2B is a schematic cross-sectional view of the filter 10 of FIG. 2A, according to some exemplary embodiments. Referring to FIG. 2B, the filter 10 includes end stops 11 in the end sections 13 of the filter 10, for connecting to tubing of the fluid path. The filter 10 includes the filter mesh 37, which is configured according to the present disclosure to capture ice crystals. As noted above, in some exemplary embodiments, the filter mesh is configured or sized to capture ice particles having a size of 2.0 µm or more. In some exemplary embodiments, the filter mesh is configured or sized to capture ice particles having a size of 10.0 µm or less. In some exemplary embodiments, the filter mesh is configured or sized to capture ice particles having a size of 100.0 µm or less. The filter mesh 37 is mounted to the inside diameter of the central section 12 of the main body of the filter 10 by a ring 39. In some exemplary embodiments, the ring 39 can be crimped to capture the edge of the filter mesh 37 and is then press fit into the inside diameter of the central section 12 of the filter 10. The ring 39 can be made of, for example, a metal such as brass.

In some particular exemplary embodiments, the filter mesh 37 is made of stainless steel, and is configured in a multi-layer Dutch weave configuration. In some particular exemplary embodiments, it can be of the type of wire mesh manufactured and sold by TWP, Inc. of Berkeley, Calif., USA, under its part number 325×2300TL0014W48T. According to the disclosure, the filter mesh 37 is configured to have a concave basket shape, as shown in FIG. 2B. This shape and the size of the concave basket mesh are chosen to define the total surface area for the filter mesh 37, such that the overall pressure differential across the filter 10 is as desired. Other factors which affect the pressure differential across the filter 10 include the diameter of the filter. In some particular exemplary embodiments, the desired maximum pressure differential across the filter is 20 psi, or less. Accordingly, in the present disclosure, the filter 10 is approximately 2.0 inches in diameter and is approximately 7.0 inches in length. According to the disclosure, other mesh sizes and surface areas, as well as other filter diameters and lengths may be selected, based on the particular application and/or the desired maximum pressure differential across the filter 10.

Figure 3:
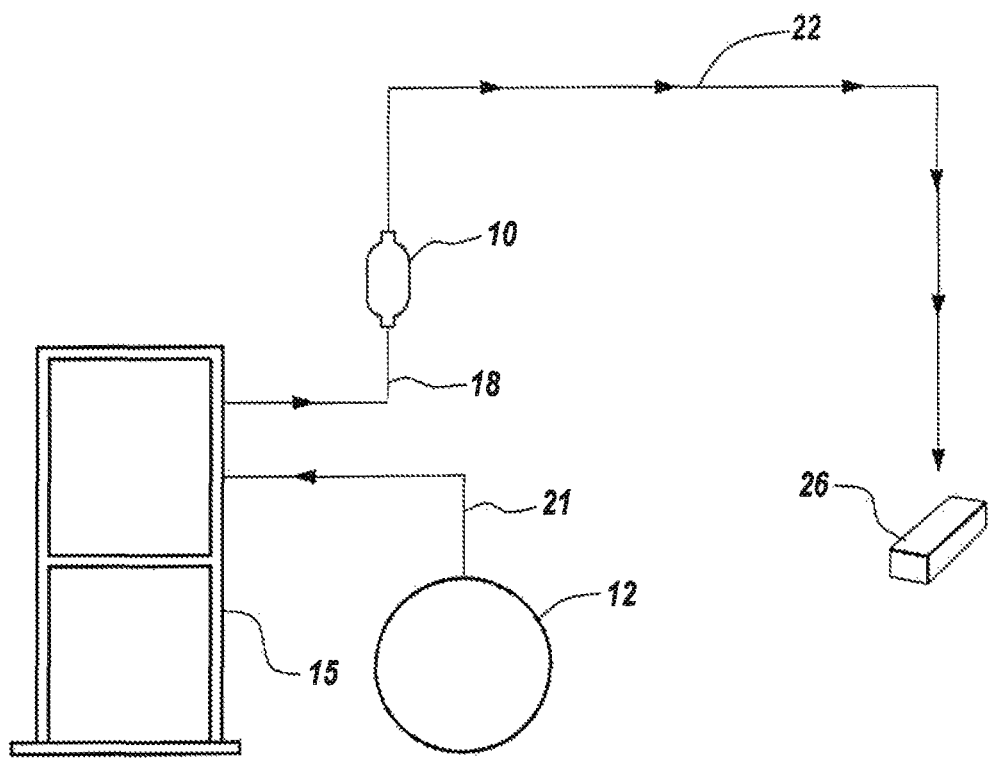
FIG. 3 is a schematic block diagram illustrating a temperature system, according to other exemplary embodiments.

FIG. 3 is a schematic block diagram illustrating a temperature system, according to exemplary embodiments. The temperature control system of FIG. 3 includes the particle filter 10 of FIGS. 2A and 2B. In FIG. 3, a fluid supply 12 outputs a fluid, for example, ambient air, to a chiller 15 along a fluid path 21. The chiller 15 chills the fluid and outputs the chilled fluid to the ice particle filter 10 along fluid path 18. When the temperature of the fluid from the chiller 4 reaches its dew point, ice crystals are generated. The ice particle filter 10 filters out ice particles formed by the chilling of the fluid in the chiller 15 and other particles which may cause charge generation in the fluid stream. The filtered fluid is outputted to a DUT 26 along fluid path 22. In some embodiments, the DUT 26 may be supported by a workpiece chuck such as those described herein.

It should be noted that according to the present disclosure, the output chilled air need not be directed onto a DUT. That is, the present disclosure is applicable to any configuration in which chilled air is output, even independent of any testing environment.

Figure 4:
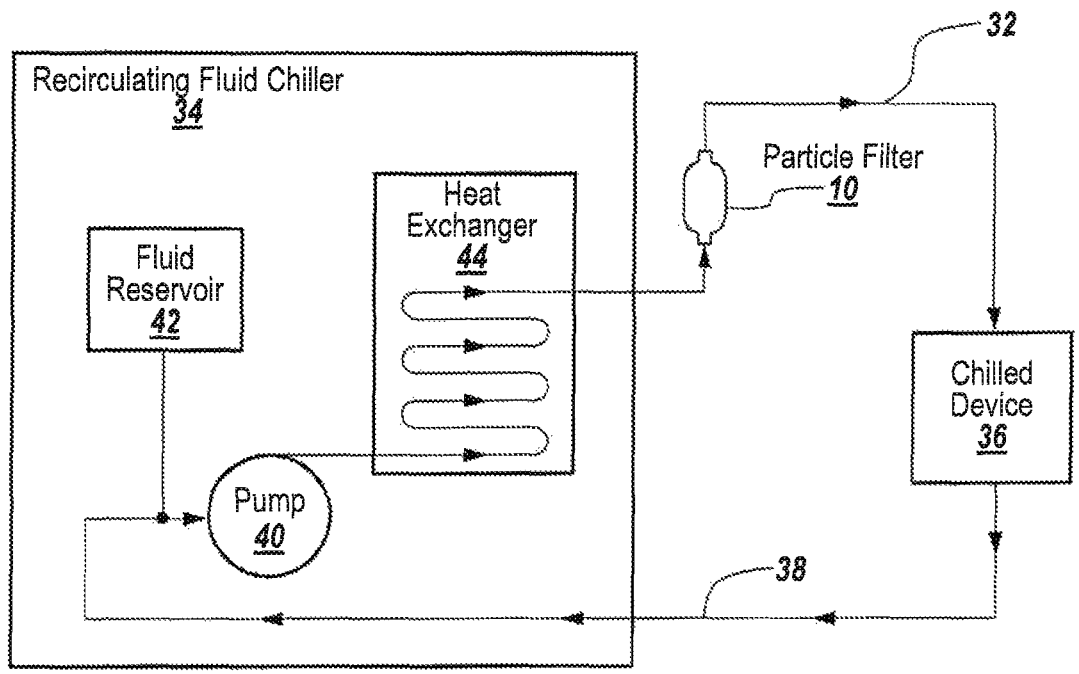
FIG. 4 is a schematic block diagram illustrating a temperature system, according to other exemplary embodiments.

FIG. 4 is a schematic block diagram illustrating a temperature system, according to exemplary embodiments. The temperature system of FIG. 4 includes the ice particle filter 10 of FIGS. 2A and 2B. FIG. 4 illustrates a temperature system which circulates a fluid through a chilled device 36. In some exemplary embodiments, the chilled device 36 may support a DUT. A circulating fluid chiller 34 includes a fluid reservoir 42, a heat exchanger 44 and a pump 40. The fluid reservoir 42 stores the fluid for the temperature system. The fluid reservoir 42 holds enough fluid to accommodate expansion and contraction of the fluid over the wide operating temperature range of the temperature system. The pump 40 circulates the fluid through the system. The heat exchanger 44 chills the fluid. The circulating fluid chiller 34 outputs the chilled fluid to the ice particle filter 10. When the circulating fluid chiller 34 reaches the dew point of the fluid circulating in the system, ice crystals are generated. The ice particle filter 10 filters out ice particles formed by the chilling of the fluid in the circulating fluid chiller 34 and other particles which may cause charge generation in the fluid stream. The filtered fluid is provided to the chilled device 36 along fluid path 32. The chilled device 36 may be, for example, a workpiece chuck or wafer chuck. The fluid is circulated through the device 36 and back to the circulating fluid chiller 34 along fluid path 38.

As noted above, in one embodiment, the chilled device 36 of FIG. 4 is a workpiece chuck which can support a DUT, such as those described in detail below in connection with FIG. 5.

In hot and cold test systems, a workpiece chuck or wafer chuck can be used to hold workpieces such as semiconductor wafers during testing. In a typical system, the wafer is mounted on the top surface of a wafer chuck, which is held at its bottom surface to a support structure of the host machine. A vacuum, electrostatic or other type of wafer holding system is typically connected to the chuck.

The chuck may include a temperature control system which raises and lowers the temperature of the chuck surface and the wafer as required to perform the desired temperature screening of the wafer. It is important to the accuracy of such testing that the temperature of the wafer and, therefore, the temperature of the chuck surface, be controlled as accurately as possible.

Various approaches to controlling the temperature have been employed. To allow for temperature screening of the wafer circuits, the chuck may include a heater for heating the wafer to a desired temperature and a heat sink for cooling the wafer as needed. A testing means in conjunction with the chuck may then be used to analyze performance of the wafer circuits at various temperatures within a predetermined temperature range.

The chuck can include a heater and a circulation system through which a cooling fluid is circulated. Alternatively, a temperature-controlled fluid and a chuck heater can be used to control the workpiece temperature. Alternatively, only a fluid can be used to control the workpiece temperature.

The fluid being circulated through the test system may be, for example, air, nitrogen or other heat transfer media.

Figure 5:
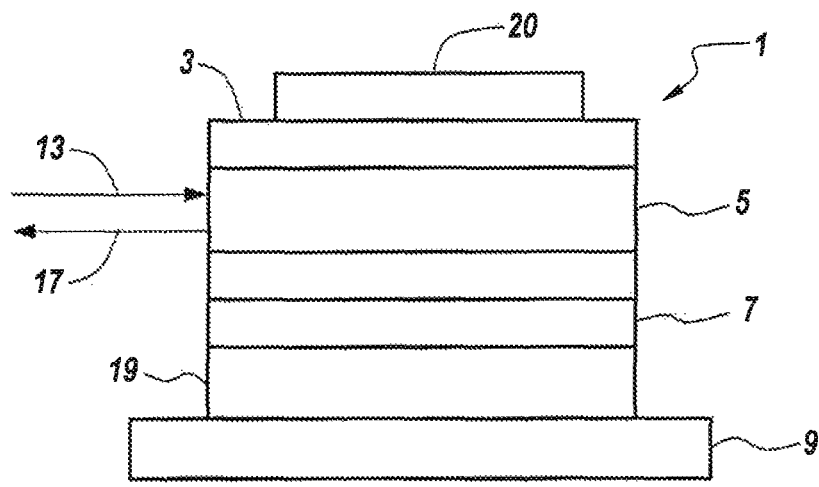
FIG. 5 is a schematic cross-sectional view of a chuck, according to some exemplary embodiments.

FIG. 5 is a schematic perspective view of one embodiment of a workpiece chuck, according to some exemplary embodiments. The chuck 1 includes a lower plate 19 which is mounted to a base 9. The chuck 1 may be of the type described in, for example, U.S. Pat. No. 6,019,164, issued Feb. 1, 2000, entitled, "Workpiece Chuck," assigned to Temptronic Corporation, and incorporated herein in its entirety by reference; U.S. Pat. No. 6,073,681, issued Jun. 13, 2000, entitled, "Workpiece Chuck," assigned to Temptronic Corporation, and incorporated herein in its entirety by reference; U.S. Pat. No. 6,328,096, issued Dec. 11, 2001, entitled, "Workpiece Chuck," assigned to Temptronic Corporation, and incorporated herein in its entirety by reference; U.S. Pat. No. 6,700,099, issued on Jul. 6, 2001, assigned to Temptronic Corporation, and incorporated herein in its entirety by reference; U.S. Pat. No. 6,744,270, issued on Jun. 1, 2004, entitled, "Temperature-Controlled Thermal Platform for Automated Testing," assigned to Temptronic Corporation, and incorporated herein in its entirety by reference; and/or any chuck manufactured and sold by Temptronic Corporation.

A top surface 3 of the chuck 1 can be used to hold a flat workpiece or DUT 20 such as a semiconductor wafer during processing. To implement temperature cycling, a heat sink 5 through which fluid can be circulated and an electrical heater 7 can be used to heat the wafer 20. A temperature control system may control the heater 7 and the temperature and flow of the fluid through the heat sink 5 in order to control the temperature of the chuck and, therefore, the temperature of the wafer under test 20. The fluid is carried into the heat sink 5 via an inlet line 13 and out of the heat sink 5 via a return line 17. The fluid may be a liquid or air.

With regard to FIGS. 1 and 3, the DUTs 16 and 26 may be supported by a workpiece chuck such as those described in connection with FIG. 5.

In FIGS. 1 and 3, in one embodiment, the DUTs 16 and 26 may be supported by a chuck of the type described in U.S. Pat. No. 6,744,270, issued on Jun. 1, 2004, entitled, "Temperature-Controlled Thermal Platform for Automated Testing," assigned to Temptronic Corporation and incorporated herein by reference, in which a thermal plate is made of a porous thermally conductive material. In this embodiment, the temperature-controlled fluid output from the control heater 14 of FIG. 1 and the fluid path 22 of FIG. 3, enters and propagates radially through the porous material of the thermal plate. The temperature of the DUTs 16 and 26 is controlled by controlling the temperature of the fluid passing through the thermal plate.

According to the exemplary embodiments of the present disclosure, flow electrification is substantially reduced. Ice crystals that are formed in the fluid path between a chiller and a point of delivery of the fluid are captured so that particles that lead to significant charge generation are removed. The ice crystals are captured by a filter which is sized to capture ice crystals and other particles which may generate a charge. The filter eliminates electrostatic charge collection. Thus, when the fluid is output, the point of delivery is not subjected to high voltages as a result of static charge generation.

While this invention has been particularly shown and described with references to preferred embodiments thereof, it will be understood to those skilled in the art that various changes in form and details may be made herein without departing from the spirit and scope of the invention as defined in the appended claims.

The invention claimed is:

1. A temperature control system for providing a temperature-controlled fluid, comprising:
    a source of fluid;
    a fluid chiller receiving fluid from the source, chilling the fluid to generate the temperature-controlled fluid and outputting the temperature-controlled fluid, wherein the temperature-controlled fluid comprises air; and
    a filter receiving the temperature-controlled fluid, the filter having a filter mesh sized to capture ice particles in the temperature-controlled fluid.

2. The temperature control system of claim 1, wherein the filter mesh is sized to capture ice particles having a size greater than or equal to 2 μm.

3. The temperature control system of claim 1, wherein the filter mesh is sized to capture ice particles having a size less than 10 μm.

4. The temperature control system of claim 1, wherein the filter mesh is sized to capture ice particles having a size less than 100 μm.

5. The temperature control system of claim 1, wherein the temperature-controlled fluid comprises a liquid.

6. The temperature control system of claim 1, wherein the filter mesh comprises stainless steel.

7. The temperature control system of claim 1, wherein the filter mesh is in a Dutch weave configuration.

8. The temperature control system of claim 1, further comprising a heater for heating the temperature-controlled fluid.

9. The temperature control system of claim 8, wherein the heater receives the temperature-controlled fluid from the filter.

10. The temperature control system of claim 8, wherein the temperature-controlled fluid is directed onto a device under test (DUT) to control temperature in the DUT.

11. The temperature control system of claim 1, wherein the temperature-controlled fluid is directed onto a device under test (DUT) to control temperature in the DUT.

12. A temperature control system for providing a temperature-controlled comprising:
    a source of fluid;
    a fluid chiller receiving fluid from the source, chilling the fluid to generate the temperature-controlled fluid and outputting the temperature-controlled fluid; and
    a filter receiving the temperature-controlled fluid, the filter having a filter mesh sized to capture ice particles in the temperature-controlled fluid, wherein the filter mesh is sized to capture ice particles having a size greater than or equal to 2 μm.

13. The temperature control system of claim 12, wherein the temperature-controlled fluid comprises air.

14. The temperature control system of claim 12, wherein the temperature-controlled fluid comprises a liquid.

15. The temperature control system of claim 12, wherein the temperature-controlled fluid is directed onto a device under test (DUT) to control temperature in the DUT.

16. A temperature control system for providing a temperature-controlled fluid, comprising:
    a source of fluid;
    a fluid chiller receiving fluid from the source, chilling the fluid to generate the temperature-controlled fluid and outputting the temperature-controlled fluid; and
    a filter receiving the temperature-controlled fluid, the filter having a filter mesh sized to capture ice particles in the temperature-controlled fluid, wherein the filter mesh is sized to capture ice particles having a size less than 10 μm.

17. The temperature control system of claim 16, wherein the temperature-controlled fluid comprises air.

18. The temperature control system of claim 16, wherein the temperature-controlled fluid comprises a liquid.

19. The temperature control system of claim 16, wherein the temperature-controlled fluid is directed onto a device under test (DUT) to control temperature in the DUT.

20. A temperature control system for providing a temperature-controlled fluid, comprising:
a source of fluid;
a fluid chiller receiving fluid from the source, chilling the fluid to generate the temperature-controlled fluid and outputting the temperature-controlled fluid; and
a filter receiving the temperature-controlled fluid, the filter having a filter mesh sized to capture ice particles in the temperature-controlled fluid, wherein the filter mesh is sized to capture ice particles having a size less than 100 μm.

21. The temperature control system of claim 20, wherein the temperature-controlled fluid comprises air.

22. The temperature control system of claim 20, wherein the temperature-controlled fluid comprises a liquid.

23. The temperature control system of claim 20, wherein the temperature-controlled fluid is directed onto a device under test (DUT) to control temperature in the DUT.

24. A temperature control system for providing a temperature-controlled fluid, comprising:
a source of fluid;
a fluid chiller receiving fluid from the source, chilling the fluid to generate the temperature-controlled fluid and outputting the temperature-controlled fluid; and
a filter receiving the temperature-controlled fluid, the filter having a filter mesh sized to capture ice particles in the temperature-controlled fluid, wherein the filter mesh comprises stainless steel.

25. The temperature control system of claim 24, wherein the temperature-controlled fluid comprises air.

26. The temperature control system of claim 24, wherein the temperature-controlled fluid comprises a liquid.

27. The temperature control system of claim 24, wherein the temperature-controlled fluid is directed onto a device under test (DUT) to control temperature in the DUT.

28. A temperature control system for providing a temperature-controlled fluid, comprising:
a source of fluid;
a fluid chiller receiving fluid from the source, chilling the fluid to generate the temperature-controlled fluid and outputting the temperature-controlled fluid; and
a filter receiving the temperature-controlled fluid, the filter having a filter mesh sized to capture ice particles in the temperature-controlled fluid, wherein the filter mesh is in a Dutch weave configuration.

29. The temperature control system of claim 28, wherein the temperature-controlled fluid comprises air.

30. The temperature control system of claim 28, wherein the temperature-controlled fluid comprises a liquid.

31. The temperature control system of claim 28, Wherein the temperature-controlled fluid is directed onto a device under test (DUT) to control temperature in the DUT.

32. A temperature control system for providing a temperature-controlled fluid, comprising:
a source of fluid;
a fluid chiller receiving fluid from the source, chilling the fluid to generate the temperature-controlled fluid and outputting the temperature-controlled fluid;
a heater for heating the temperature-controlled fluid; and
a filter receiving the temperature-controlled fluid, the filter having a filter mesh sized to capture ice particles in the temperature-controlled fluid.

33. The temperature control system of claim 32, wherein the heater receives the temperature-controlled fluid from the filter.

34. The temperature control system of claim 33, wherein the temperature-controlled fluid is directed onto a device under test (DUT) to control temperature in the DUT.

35. The temperature control system of claim 32, wherein the temperature-controlled fluid comprises air.

36. The temperature control system of claim 32, wherein the temperature-controlled fluid comprises a liquid.

37. The temperature control system of claim 32, wherein the temperature-controlled fluid is directed onto a device under test (DUT) to control temperature in the DUT.

38. A temperature control system for providing a temperature-controlled fluid, comprising:
a source of fluid;
a fluid chiller receiving fluid from the source, chilling the fluid to generate the temperature-controlled fluid and outputting the temperature-controlled fluid; and
a filter receiving the temperature-controlled fluid, the filter having a filter mesh sized to capture ice particles in the temperature-controlled fluid, wherein the temperature-controlled fluid is directed onto a device under test (DUT) to control temperature in the DUT.

39. The temperature control system of claim 38, wherein the temperature-controlled fluid comprises air.

40. The temperature control system of claim 38, wherein the temperature-controlled fluid comprises a liquid.

\* \* \* \* \*